US006614258B2

(12) United States Patent
Song

(10) Patent No.: US 6,614,258 B2
(45) Date of Patent: Sep. 2, 2003

(54) FIELD-PROGRAMMABLE DYNAMIC LOGIC ARRAY

(75) Inventor: Seungyoon P. Song, East Palo Alto, CA (US)

(73) Assignee: Elan Research, Mt. View, CA (US)

(*) Notice: Subject to any disclaimer, the term of this patent is extended or adjusted under 35 U.S.C. 154(b) by 0 days.

(21) Appl. No.: 10/071,966

(22) Filed: Feb. 5, 2002

(65) Prior Publication Data

US 2002/0118038 A1 Aug. 29, 2002

Related U.S. Application Data

(63) Continuation-in-part of application No. 09/640,486, filed on Aug. 16, 2000, now Pat. No. 6,433,581.

(51) Int. Cl.⁷ .............................................. H03K 19/177
(52) U.S. Cl. ............................. 326/39; 326/40; 326/95; 326/98
(58) Field of Search ............................. 326/38–41, 95, 326/98

(56) References Cited

U.S. PATENT DOCUMENTS 5,874,834 A * 2/1999 New ............................ 326/39
6,211,697 B1 * 4/2001 Lien et al. .................... 326/41

\* cited by examiner

*Primary Examiner*—Michael Tokar
*Assistant Examiner*—Vibol Tan
(74) *Attorney, Agent, or Firm*—Sawyer Law Group LLP

(57) ABSTRACT

Dynamic PLAs are used as the basis of constructing a new class of programmable devices called field-programmable dynamic logic arrays (FPDLAs). Unlike existing programmable devices that use static logic, the FPDLAs use reprogrammable, reconfigurable, and fixed-function dynamic PLAs in programmable modules that provide both programmable logic and interconnect structures. A system of micro clocks is used to ensure that each dynamic PLA operates correctly by allowing it to start the evaluate phase after all of its inputs have become valid. Since dynamic PLAs with large number of inputs can be built in a small area due to its regular circuit structure, and they produce the outputs in a time independent of the number of inputs affecting the outputs, FPDLAs can operate at a higher speed and require a smaller area than programmable devices built using static logic.

19 Claims, 16 Drawing Sheets

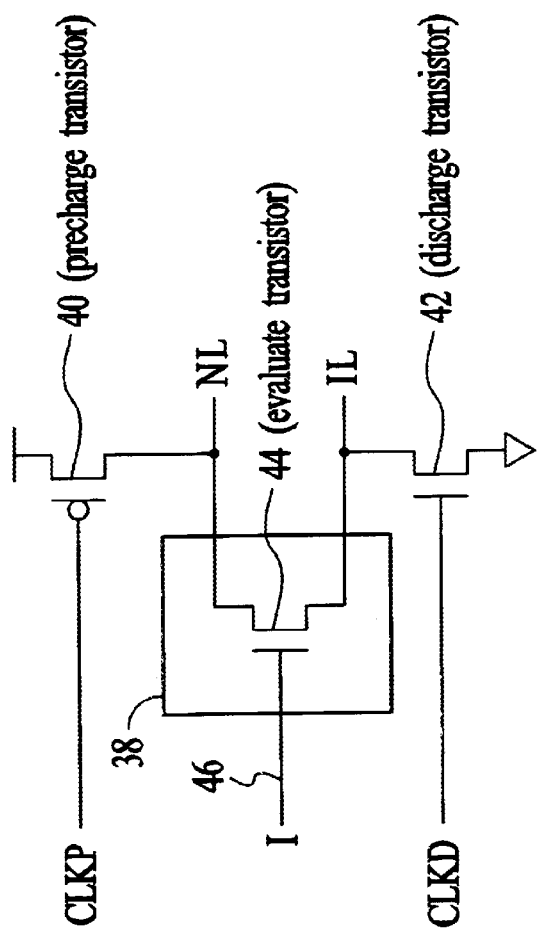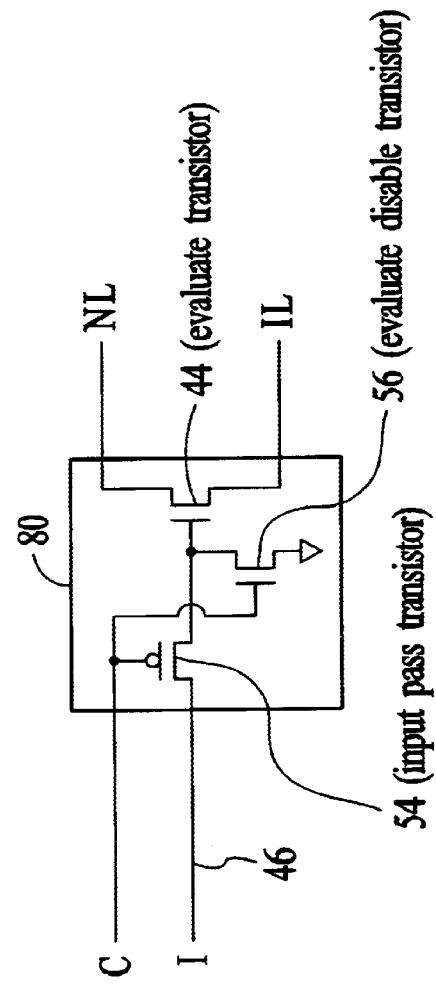
FIG. 3
(PRIOR ART)
FIG. 4

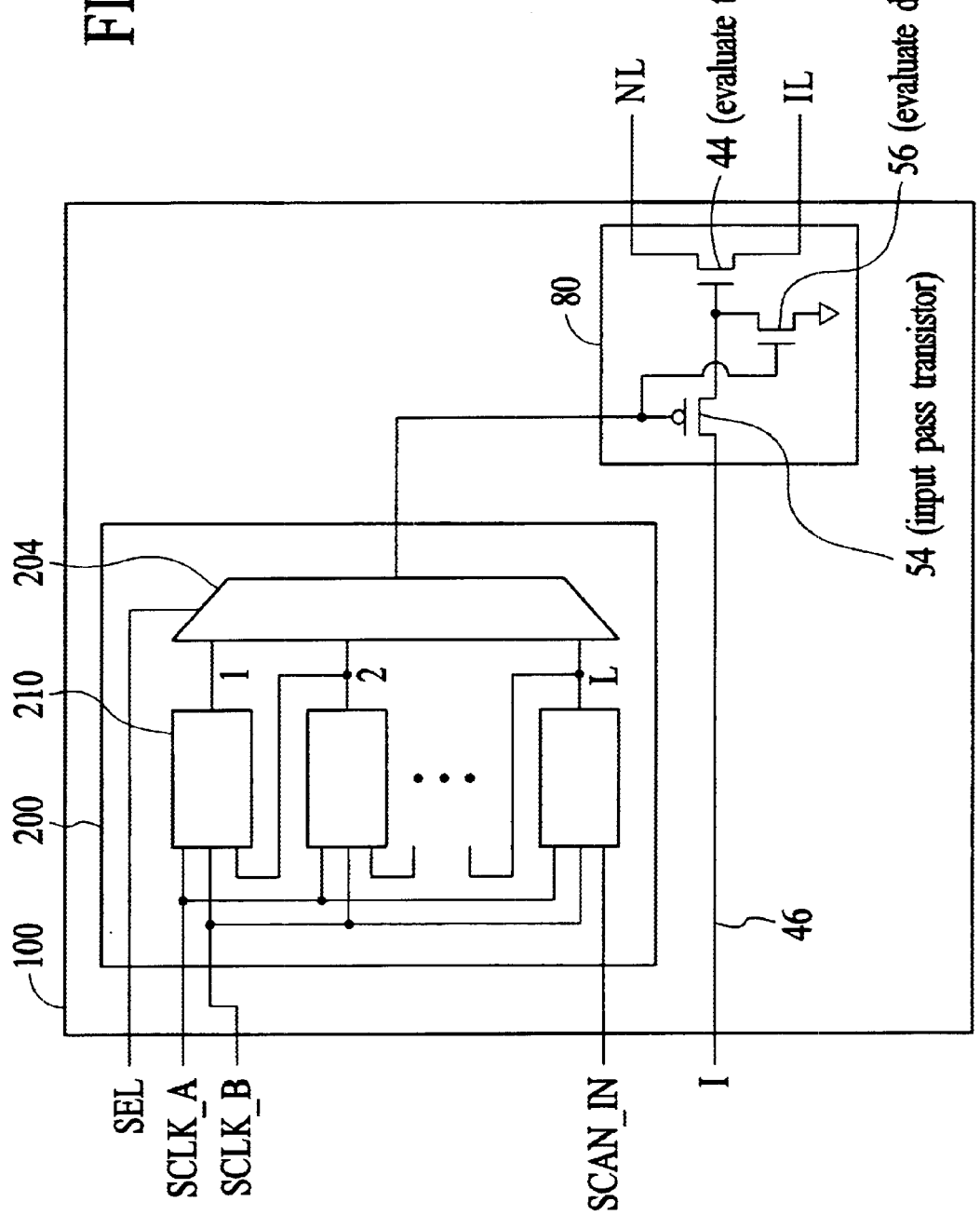

US 6,614,258 B2

FIELD-PROGRAMMABLE DYNAMIC LOGIC ARRAY

This is a continuation in part of application Ser. No. 09/640,486 filed Aug. 16, 2000, now U.S. Pat. No. 6,433,581.

FIELD OF THE INVENTION

The present invention relates generally to field-programmable gate arrays (FPGAs) and specifically to a FPGA that uses reconfigurable dynamic programmable logic arrays (DPLAs).

BACKGROUND OF THE INVENTION

A PLA (programmable logic array) produces a predetermined set of outputs for a given set of inputs. Each output is a sum-of-products of a subset of the inputs, implemented using an AND plane to generate the product terms and an OR plane to generate the sums of the product terms. A dynamic PLA implements the sum-of-products functions by precharging and conditionally discharging wired-NOR circuits that are built within the AND and OR arrays. These functions are programmed when a dynamic PLA is built such that the array can only produce the same set of output signals for a given set of input signals. A dynamic PLA is "programmable" only in the sense that it is easy to implement desired functions within the array when the array is built but not in the sense that the array can be programmed to provide different functions once the array is built.

Dynamic programmable logic arrays (DPLAs) are utilized extensively. As shown in FIG. 1, a DPLA 5 includes input signals 2 to an AND plane 10 whose outputs 18 are then the inputs to an OR plane 14 that produces the output signals 20. The outputs of the AND plane 10 are known as AND term signals (A1 to Am). The outputs of the OR plane are known as OR term signals (O1 to On). FIG. 1 shows k number of inputs, m number of AND term signals, and n number of OR term signals. The AND plane 10 further comprises multiple NOR term generators 12, each of which outputs a wired-NOR signal 18 that is first precharged to Vcc (the supply voltage) and then conditionally discharged to GND (the ground voltage). The Vcc and GND can represent high (TRUE) and low (FALSE) logic states, respectively. Similarly, the OR plane 14 also comprises multiple NOR term generators 16, each of which outputs a wired-NOR signal 20 that is first charged to high logic level and then conditionally discharged to low logic level. For simplicity, the clocks that control the precharge and discharge are not shown in FIG. 1.

FIG. 2 shows two NOR term generators 12 in the AND plane. The wired-NOR signal 30 is discharged if one or more input signals 2 that are "programmed" to affect this output signal are high. An input signal 2 is programmed to affect an output signal by providing an evaluate circuitry 32 controlled by the input signal 2. FIG. 2 shows that the input signals I1 and I2 are programmed to affect the AND term signals A1 and A2. If the evaluate circuitry labeled 34 were not provided, for example, then the input signal I1 cannot affect the AND term signal A1 while it still affects the AND term signal A2.

FIG. 3 shows a conventional evaluate circuitry 38 for DPLA and the precharge transistor 40 and the discharge transistor 42 for the AND term signal. This precharge and conditional discharge circuitry is controlled in two non-overlapping phases, known as precharge and evaluate. During the precharge phase, both CLKP and CLKD are held low so that precharge transistor 40 is turned on and the discharge transistor 42 is turned off, forcing the output signal NL to be high. During the evaluate phase, both CLKP and CLKD are held high so that the precharge transistor 40 is turned off and the discharge transistor 42 is turned on. During the evaluate phase, if the input signal 46 is high to turn on the evaluate transistor 44, then the charge stored at the output signal NL is discharged via the transistors 44 and 42, resulting in the signal NL being low. If on the other hand, if the input signal 46 is low during the evaluate phase, the evaluate transistor 44 is turned off and the charge stored at the output signal NL remains high. The input signal 46 must not change during the evaluate phase to avoid falsely discharging the output signal NL.

A NOR term generator 12, which comprises one precharge transistor and one discharge transistor and at least one evaluate circuitry, works as follows. During the precharge phase, the precharge transistor 40 is turned on and the discharge transistor 42 is turned off, forcing the output signal NL to be high. During the evaluate phase, the precharge transistor 40 is turned off and the discharge transistor 42 is turned on. During the evaluate phase, if one or more input signals that are programmed to affect this output are high, the charge stored at the output signal NL is discharged and NL becomes low. If none of the input signals are high, then there is no path for the charge stored at NL to be discharged and the NL remains high. The NOR term generators 16 in the OR plane 14 works as same as those in the AND plane 10.

FIGS. 2 and 3 show a DPLA whose output node is precharged to Vcc by a p-transistor and conditionally discharged by two n-transistors in series connected to GND. Alternatively, an n-transistor precharged to GND and conditionally discharged by two p-transistors in series connected to Vcc can be used. Furthermore, the discharge transistor 42 may be omitted if the inputs are guaranteed to be zero or one, if the evaluate transistor is an n-transistor or a p-transistor, respectively, during precharge. Multiple dynamic PLAs can also be connected in a series, known as cascaded dynamic PLAs, such that one signal starts the evaluate phase of the PLAs in succession using self-timed logic.

A detailed description of DPLA can be found in "Principles of C-MOS VLSI Design" by N. H. Weste and K. Eshraghian, Addison-Wesley, $2^{nd}$ Edition, 1993, Chapter 8, pages 595–602 or in the U.S. Pat. No. 4,769,562.

Dynamic PLA with Fine-Grained Control

The evaluate module 38 in FIG. 3 is replaced with the configurable evaluate module 80 in FIG. 4 in both the AND and OR planes to provide the complete control of the AND and OR term generators in the resulting PLA. That is, instead of using the evaluate module 38 only in the places where the input signals affect the AND term outputs and in the places where the AND term outputs affect the OR term outputs, a configurable evaluate module 80 is placed in everywhere so that every input signals can affect all AND term outputs and that every AND term output signal can affect all OR term outputs.

The configurable evaluate module 80 comprises an input pass transistor 54, an evaluate transistor 44, and an evaluate disable transistor 56. The control signal C enables either the input pass transistor 54 or the evaluate disable transistor 56 at any given time. When the input pass transistor 54 is turned on, the input signal 46 is allowed to affect the evaluate transistor 44, such that the evaluate transistor 44 is turned on or off if the input signal 46 is high or low, respectively. When the evaluate disable transistor 56 is turned on instead, the input signal 46 cannot affect the evaluate transistor 44.

This arrangement of configurable PLA results in a large number of control signals, since each conditional evaluate module 80 requires a dedicated control signal. For a PLA with K number of inputs, M number of AND terms, and N number of OR terms (or the outputs), a total of K×M+M× N=M×(K+N) number of control signals. With such a large number of control signals for a PLA, a preferred method of generating these control signals would be to store the control signals in a memory array (SRAM, DRAM, flash, electrically programmable ROM, electrically erasable programmable ROM, fusible links, or even one-time programmable memory). In this way, the array can be configured to produce any desired function by reading the control signals from the memory array. To avoid falsely discharging the evaluate transistors, the control as well as the input signals must not change during the evaluate phase.

Dynamic PLA with Built-In Configurations

Building the configurations into the array can minimize the required number of control signals. A configurable evaluate module 100 in FIG. 5 can be used instead of the configurable evaluate module 80 in FIG. 4 in every place so that every input signals can affect all AND term outputs and that every AND term output signal can affect all OR term outputs. This arrangement reduces the required number of control signals to L, where L is the number of different configurations.

The configurable evaluate module 100 comprises an input control module 200, an input pass transistor 54, an evaluate transistor 44, and an evaluate disable transistor 56. The input control module 200 comprises a plurality of input control settings 202, a multiplexor 204 and the L-bit SEL signal that selects one of the L input control settings. To select the configuration j, the jth signal in SEL is asserted and all other signals in SEL are de-asserted to allow the jth configuration to affect the signal I. Each input control setting is hardwired to the low or high logic state, depending on whether the input signal 46 should or should not affect the evaluate transistor 44, respectively, when the setting is selected. The input signal 46 and the SEL signal should not change during the evaluate phase to avoid falsely discharging the NL output.

The output of the input control module 200 enables either the input pass transistor 54 or the evaluate disable transistor 56 at any given time. When the input pass transistor 54 is turned on, the input signal 46 is allowed to affect the evaluate transistor 44, such that the evaluate transistor 44 is turned on or off if the input signal 46 is high or low, respectively. When the evaluate disable transistor 56 is turned on instead, the input signal 46 cannot affect the evaluate transistor 44.

To simplify the generation of the SEL signal, it may be desirable to place configuration holding latch 208 that can be written only during the precharge phase, as shown in FIG. 6. The latch 208 allows the SEL signal to be changed in precharge and evaluate phases.

Dynamic PLA with Built-In Reprogrammable Configurations

An input control setting 202 can be made "reprogrammable" by using a storage element, such as a latch 206 shown in FIG. 7, instead of hardwiring the setting to the low or high logic state.

FIG. 8 shows a configurable evaluate module in which all input control settings are made reprogrammable. To program all of the L input control latches 206 in one cycle, the desired values are placed on the L-bit PD signal and the PC signal is asserted (set to high and then to low). Each NOR term generator has a dedicated PC signal but shares the K number of L-bit PD signals with other generators in the AND plane so that all input control settings in the AND plane can be reprogrammed in M number of cycles, as shown in FIGS. 9 and 10. Similarly, each NOR term generator in the OR plane has a dedicated PC signal but shares the M number of L-bit PD signals so that all input control settings in the OR plane can be reprogrammed in N number of cycles. The connection of the SEL signal is not shown in these two figures. The PD, PC, input signal 46 and the SEL signals should not change during the evaluate phase to avoid falsely discharging the NL output.

All of the input control settings that are "reprogrammable" can be connected in one scan chain to minimize the number of PD and PC signals, as shown in FIG. 11. In this arrangement, the input control settings are built using scan registers 210, shown in FIG. 12, and are connected as one scan chain. That is, the scan_in signal is connected to the program data input of the first scan register whose output is then connected to the program data input of the next scan register, and so forth. The output of the last scan register in the scan chain scan_out is then connected to the scan_in of first scan register in another configurable evaluate module 100, resulting in all of the scan registers in the logic planes being connected as one scan chain. The scan control signals sclk_a and sclk_b are connected to all scan registers in the same scan chain.

If only one configuration is needed, the multiplexor 204 and all but one of the storage element can be removed, leaving the evaluate module 100 reprogrammable but not configurable. The storage element can also use SRAM, flash memory, electrically programmable ROM, electrically erasable programmable ROM, or fusible links instead of a latch.

Dynamic PLA with Partitioned Configuration Control

A dynamic PLA with built-in hardwired or reprogrammable configurations can be partitioned into multiple sub-arrays with independent configuration controls by providing multiple SEL signals. For instance, the AND plane can be divided into four sub-arrays 301, 302, 303, and 304, as shown in FIG. 13. The SEL1 signal is connected to all configurable evaluate modules 310 in the sub-array 301. Similarly, the SEL2, SEL3, and SEL4 signals are used in the sub-arrays 302, 303, and 304, respectively. Note that the input signals I1 and I2 are connected to the two upper sub-arrays 301 and 302 while the input signals I3 and I4 are connected to the two lower sub-arrays 303 and 304. Similarly, the AND term generators A1 and A2 are connected to the two left sub-arrays 301 and 303 while the A3 and A4 are connected to the two right sub-arrays 302 and 304.

An AND term output is still affected by the settings of all of the configurable evaluate modules that are connected to it. For example, the A2 AND term output signal is affected by the settings of the configurable evaluate modules in both the sub-arrays 301 and 303.

A configurable array can be partitioned into different sized sub-arrays. The widths of the configuration select (SEL) signals can also be different, since the width of a SEL signal depends on the number of configurations used in the associated sub-array. If a sub-array uses only one configuration, then it obviously does not need a SEL signal.

Dynamic PLA with Partitioned Evaluate Control

The AND or OR plane of any dynamic PLA can be partitioned into multiple sub-arrays of varying sizes, each sub-array having a separate evaluate control clock. For example, FIG. 14 shows an array partitioned into three sub-arrays 401, 402 and 403, each array having a separate evaluate control clock CLKD1, CLKD2 and CLKD3, respectively. The advantage of this type of partition is that it is easy to control whether or not all of the evaluate modules in an sub-array affect the associated AND or OR term signals. That is, one evaluate control clock can override the inputs and the configuration settings for the associated sub-array so that all of the AND or OR term outputs that are connected to the sub-array are not affected by the sub-array. The same AND or OR term outputs can still be affected by other sub-arrays. For example, by not asserting the CLKD1 signal while asserting the CLKD3 signal during the evaluate phase, the inputs I1 and I2 are made to not affect the AND term A1 while $I_3$ and $I_4$ are allowed to affect $A_1$.

Existing Programmable Semiconductor Devices

Programmable semiconductor devices are built using some combination of programmable logic structures and programmable interconnects. Programmable logic structures implement logic functions and programmable interconnects connect signals between the programmable logic structures. These devices can be programmed once and permanently or can be reprogrammed repeatedly. Many of these are known as FPGAs (field-programmable gate arrays) for their ability to be programmed "in the field" by end users. FIG. 15 shows a conceptual diagram of an existing FPGA, built using an array of CLBs (configurable logic blocks) surrounded by horizontal and vertical programmable interconnects. Each CLB consists of some amount of RAM, registers, multiplexors and a few combinational function units, which collectively can be programmed to generate any function of a small number of variables. Each input and output of a CLB can be programmed to connect to a predefined set of local interconnects, allowing most connections between adjacent CLBs to take place without using the horizontal and vertical interconnects. A programmable switching matrix is used at each junction of the horizontal and vertical interconnects, allowing desired connections between horizontal and vertical wires used for connecting signals between non-adjacent CLBs.

A detailed description of programmable CMOS devices can be found in "Principles of CMOS VLSI Design" by N. H. Weste and K. Eshraghian, Addison-Wesley, $2^{nd}$ Edition, 1993, Chapter 6, pages 391–413.

Existing programmable semiconductor devices use static logic, as opposed to dynamic logic, in the programmable logic structures and interconnects, allowing any amount of logic structures and interconnects to be used within an arbitrarily long clock period simply by stretching the clock period. While requiring a simple clock control scheme, such devices are inadequate for implementing large, high-speed designs. What is needed is a better programmable semiconductor device that operates at a higher speed and requires a smaller area in implementing large, high-speed designs. The present invention addresses such a need.

SUMMARY OF THE INVENTION

Dynamic PLAs are used as the basis of constructing a new class of programmable devices called field-programmable dynamic logic arrays (FPDLAs). Unlike existing programmable devices that use static logic, the FPDLAs use reprogrammable and reconfigurable dynamic PLAs in programmable modules that provide both programmable logic and interconnect structures. A system of micro clocks is used to ensure that each dynamic PLA operates correctly by allowing it to start the evaluate phase after all of its inputs have become valid. Since dynamic PLAs with large numbers of inputs can be built in a small area, due to their regular circuit structure, and they produce the outputs in a time independent of the number of inputs affecting the outputs, FPDLAs can operate at a higher speed and require a smaller area than programmable devices built using static logic.

BRIEF DESCRIPTION OF THE DRAWINGS

FIG. 3 shows a conventional evaluate circuitry for DPLA and the precharge transistor and the discharge transistor for the AND term signal.

FIG. 4 shows a configurable evaluate module for DPLA.

FIG. 11 shows all of the input control settings that are scan registers that can be connected in one scan chain to minimize the number of PD and PC signals.

DETAILED DESCRIPTION

The present invention relates generally to field-programmable gate arrays (FPGAs) and specifically to a FPGA that uses reprogrammable and reconfigurable dynamic programmable logic arrays (DPLAs). The following description is presented to enable one of ordinary skill in the art to make and use the invention and is provided in the context of a patent application and its requirements. Various modifications to the preferred embodiment and the generic principles and features described herein will be readily apparent to those skilled in the art. Thus, the present invention is not intended to be limited to the embodiment shown but is to be accorded the widest scope consistent with the principles and features described herein.

Figure 1:
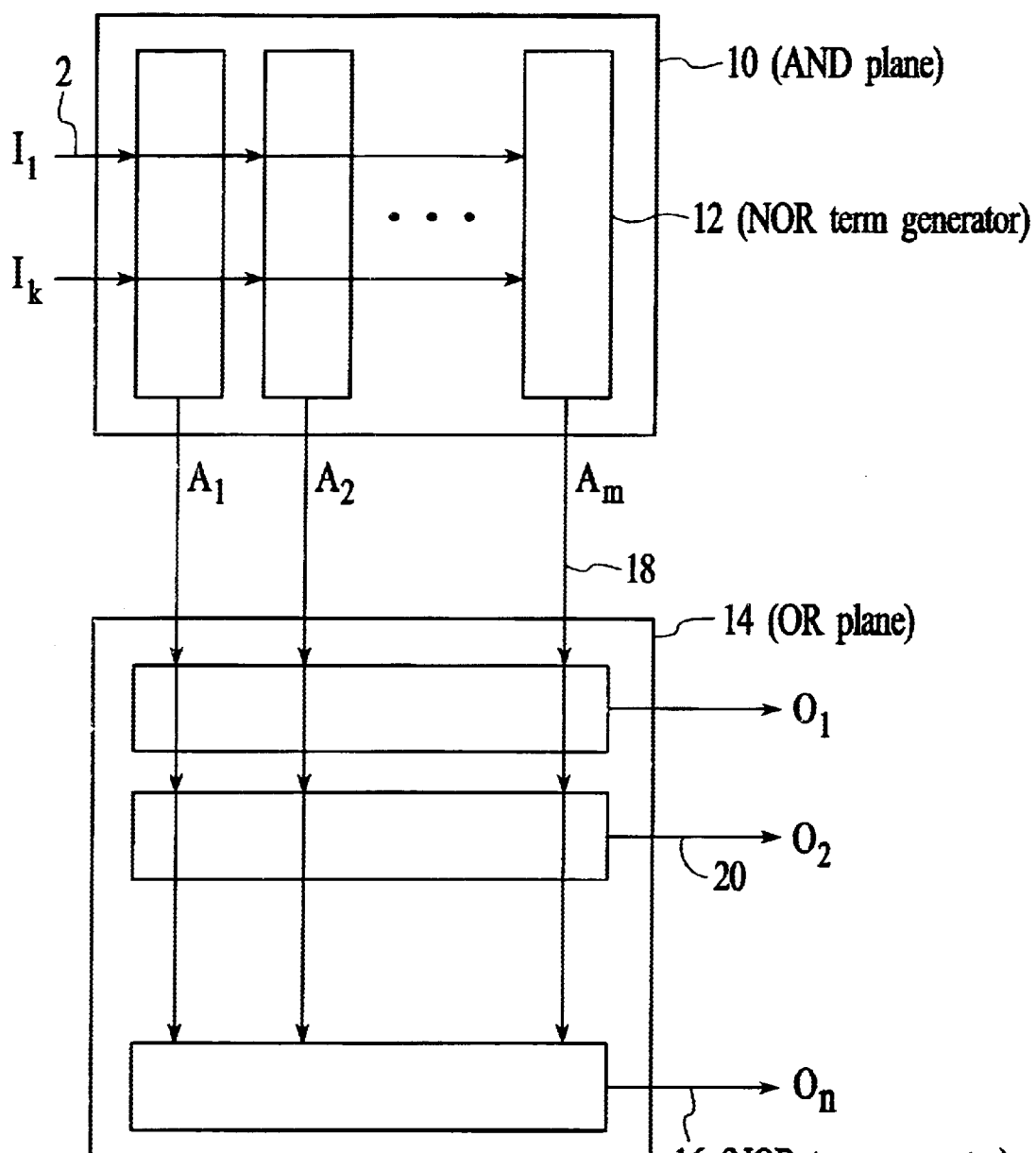
FIG. 1 shows a conventional dynamic programmable logic array (DPLA).
Figure 2:
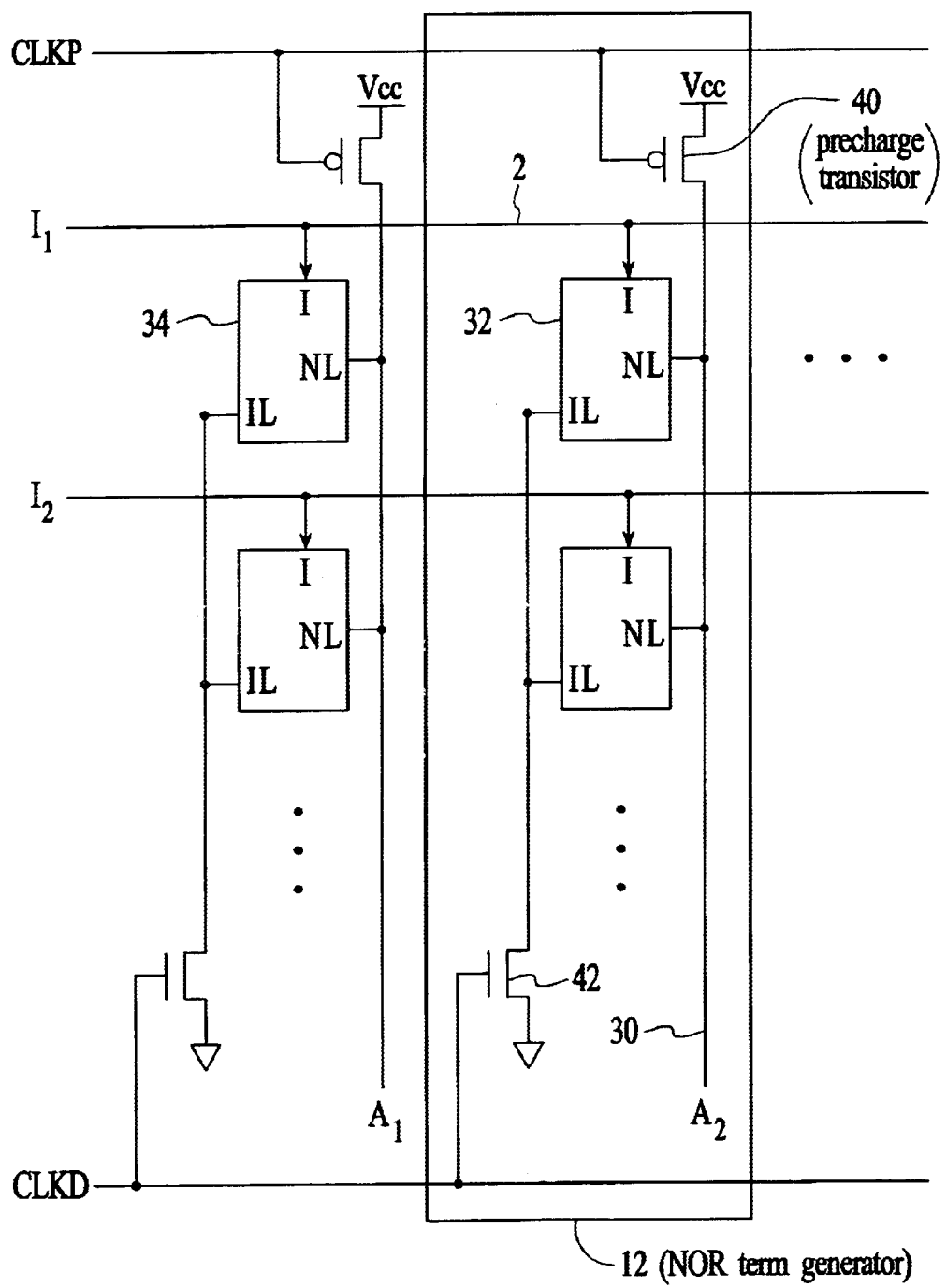
FIG. 2 shows two NOR term generators in the AND plane.
Figure 5:
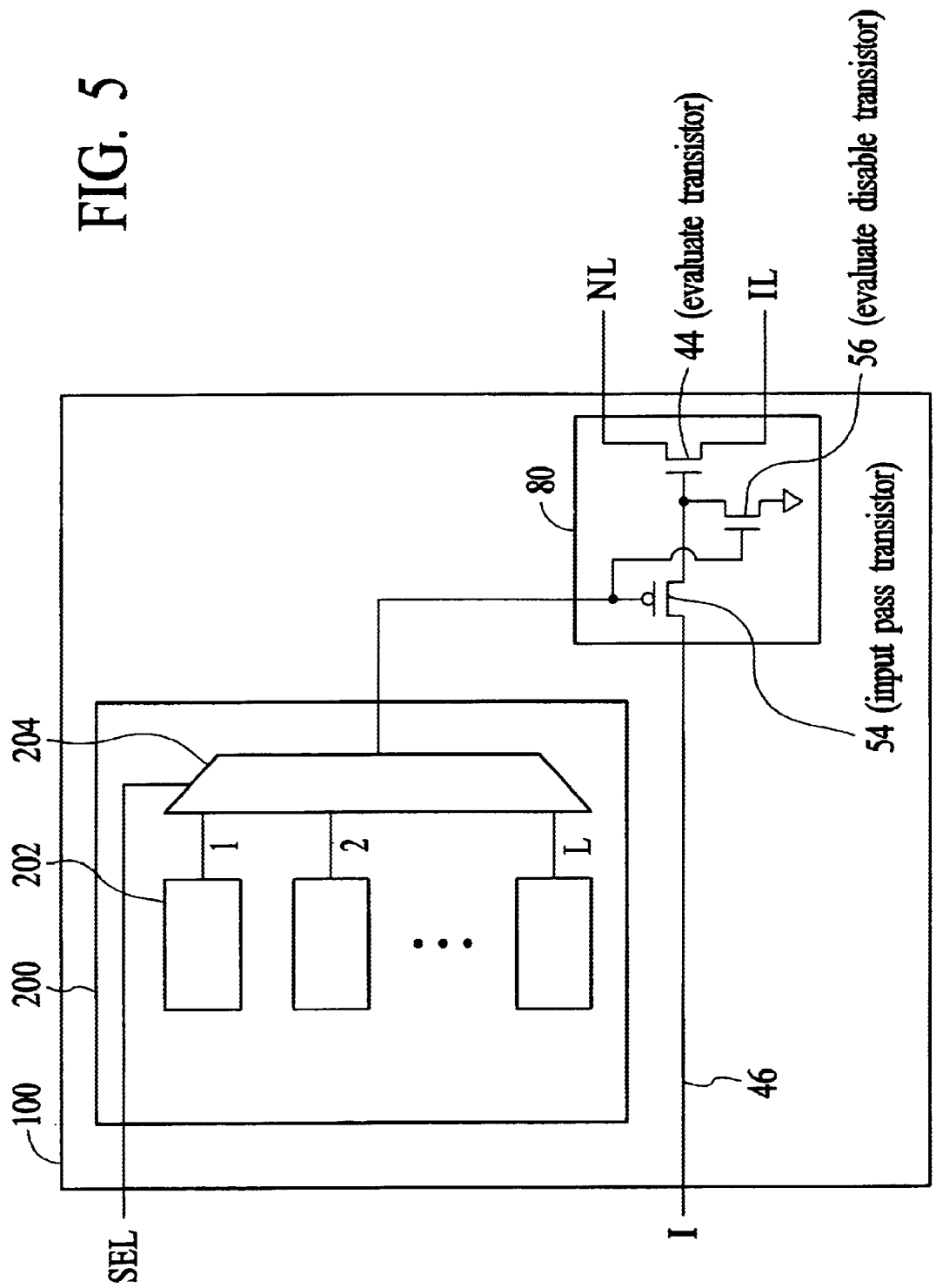
FIG. 5 shows a configurable evaluate module with built-in configurations.
Figure 6:
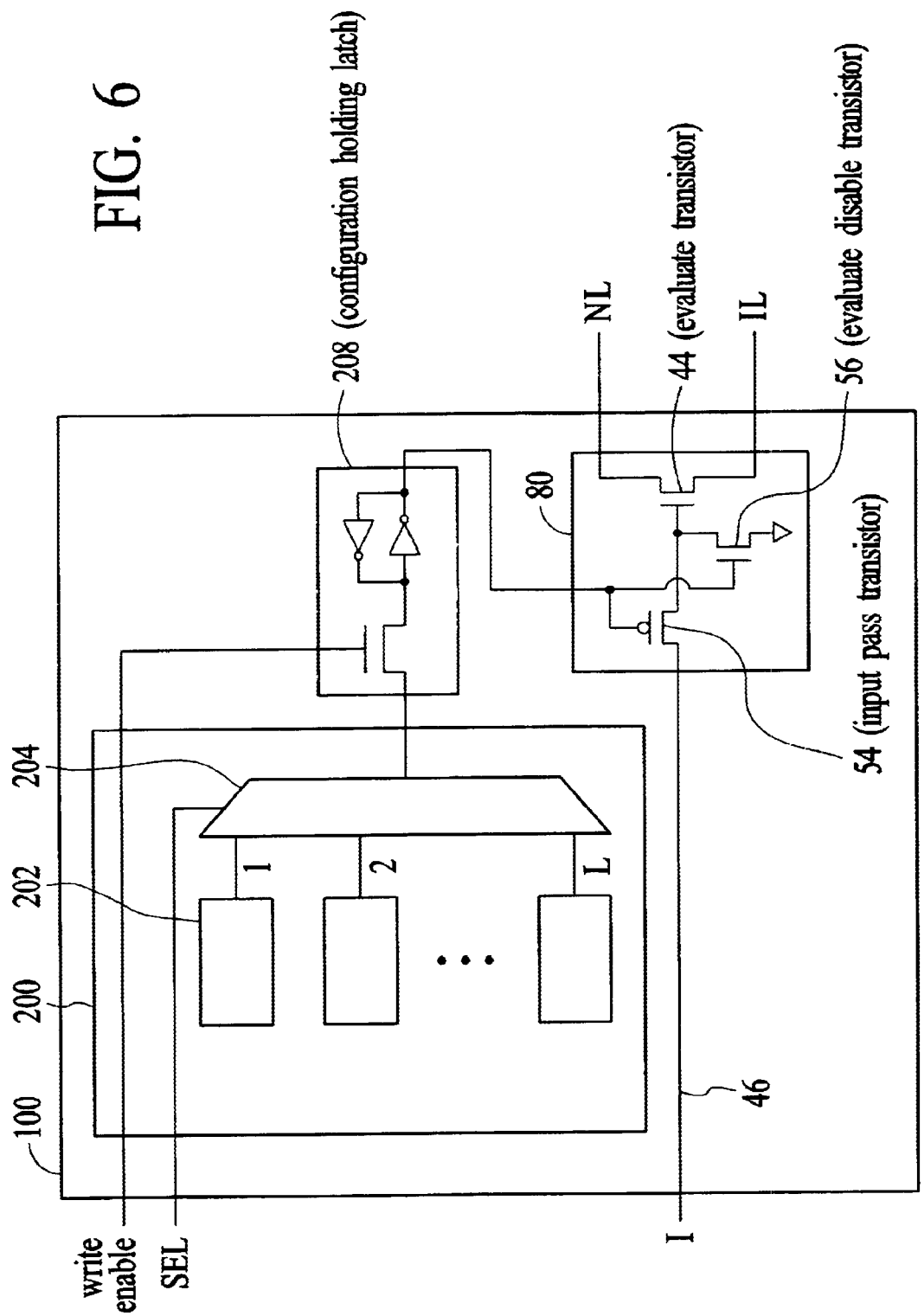
FIG. 6 shows a configurable evaluate module with built-in configurations and a configuration holding latch.
Figure 7:
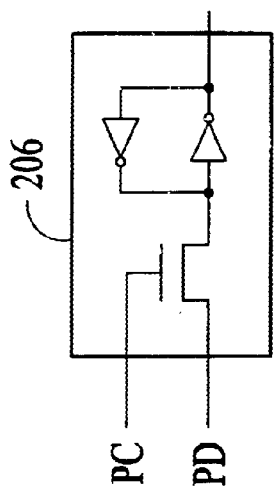
FIG. 7 shows a latch that can be used as a reprogrammable evaluate module.
Figure 12:
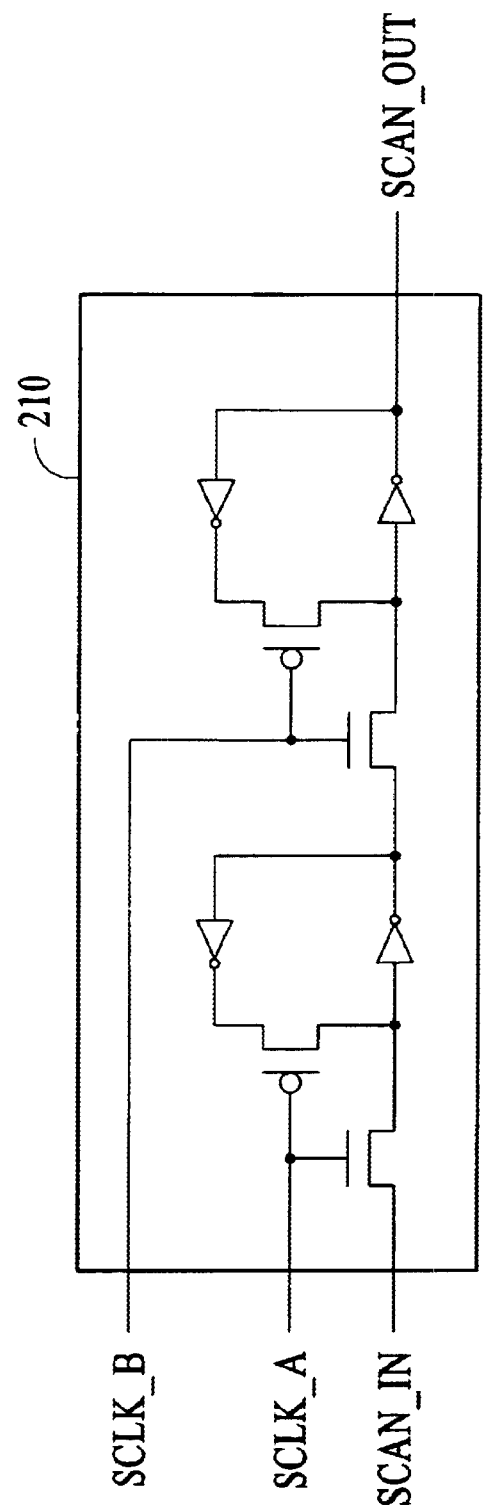
FIG. 12 shows a scan register.
Figure 8:
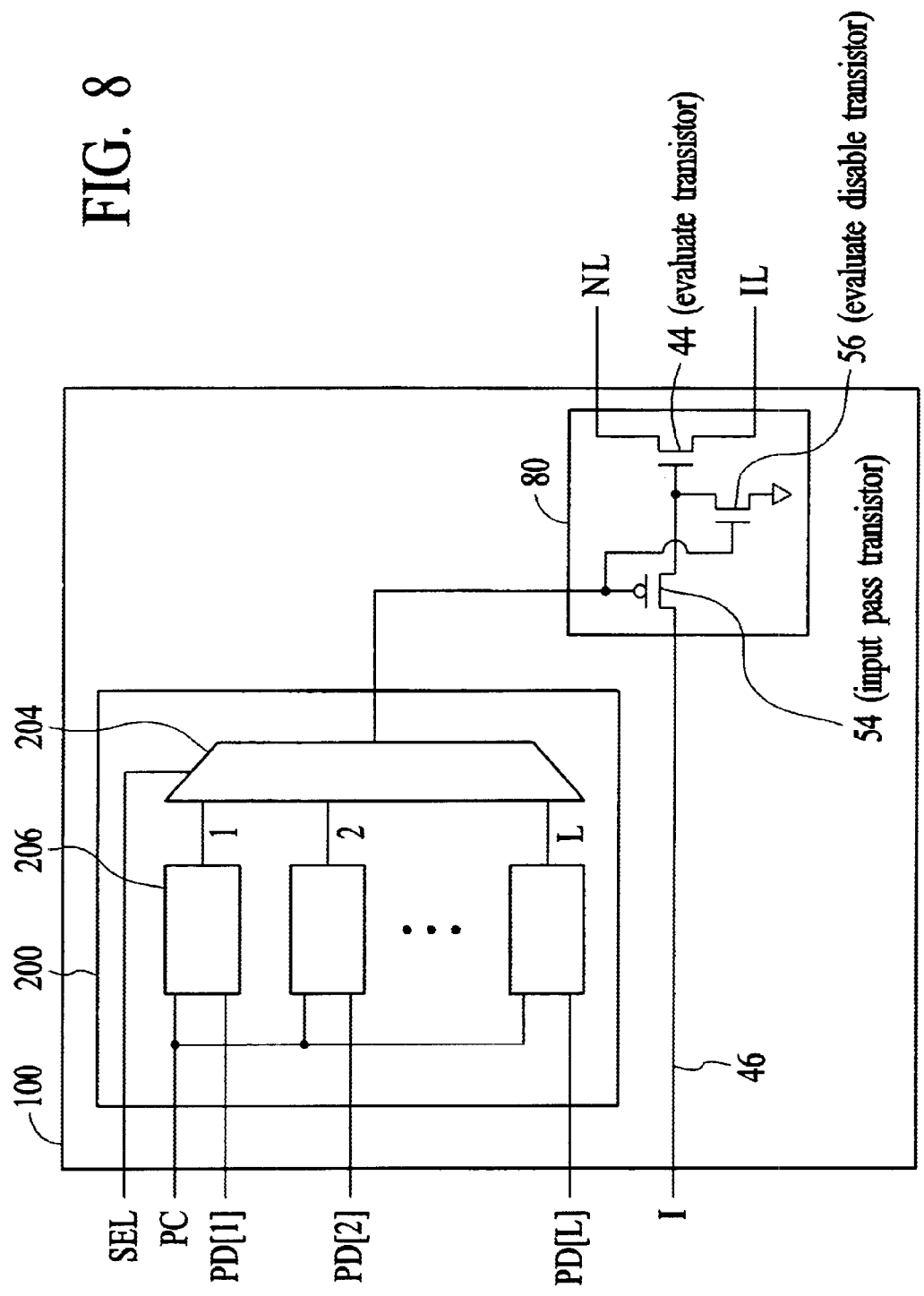
FIG. 8 shows a configurable evaluate module using latches as input control settings to provide reprogrammability.
Figure 9:
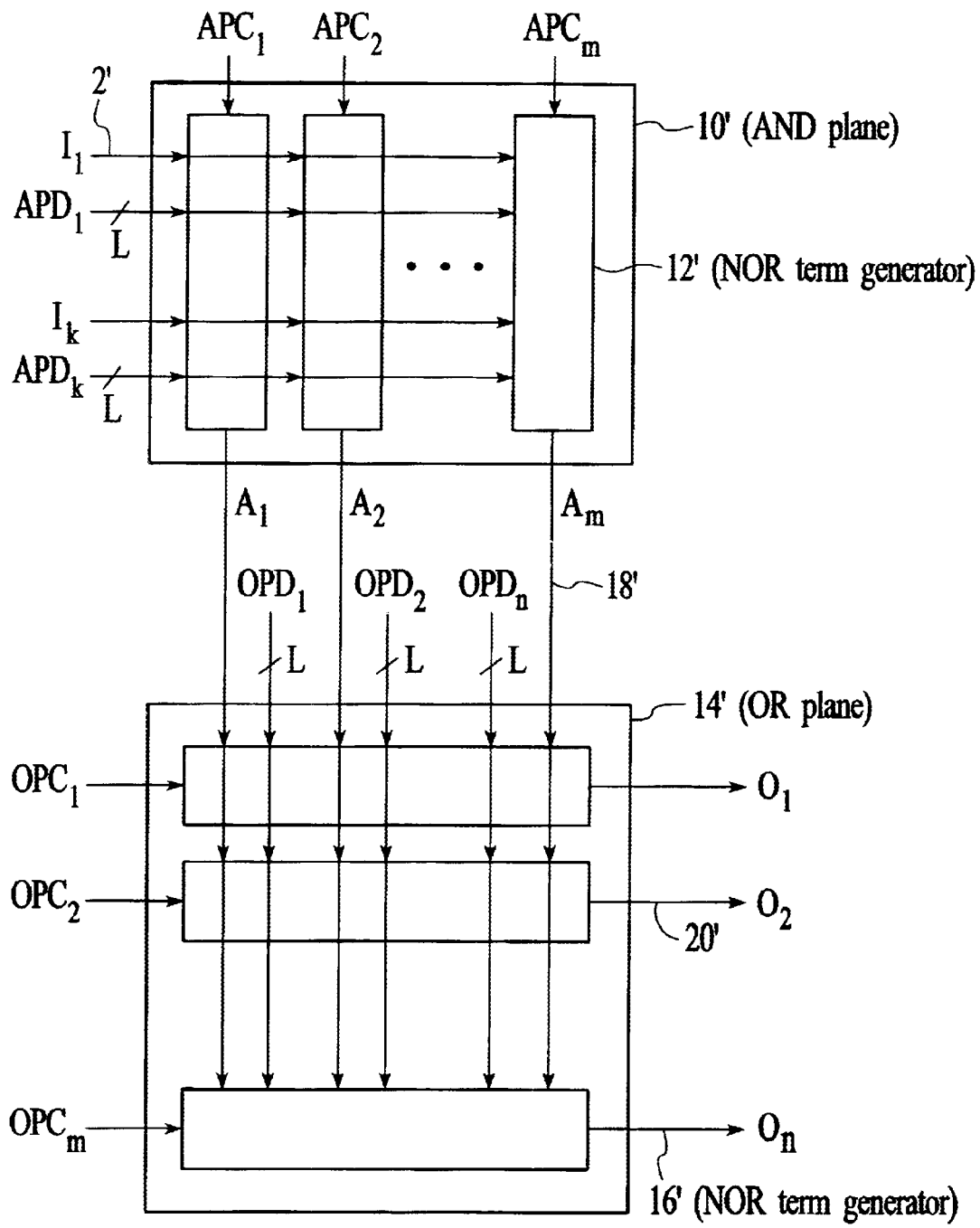
FIGS. 9 and 10 show configurable DPLA that is populated with reprogrammable evaluate modes, as shown in FIG. 8.
Figure 10:
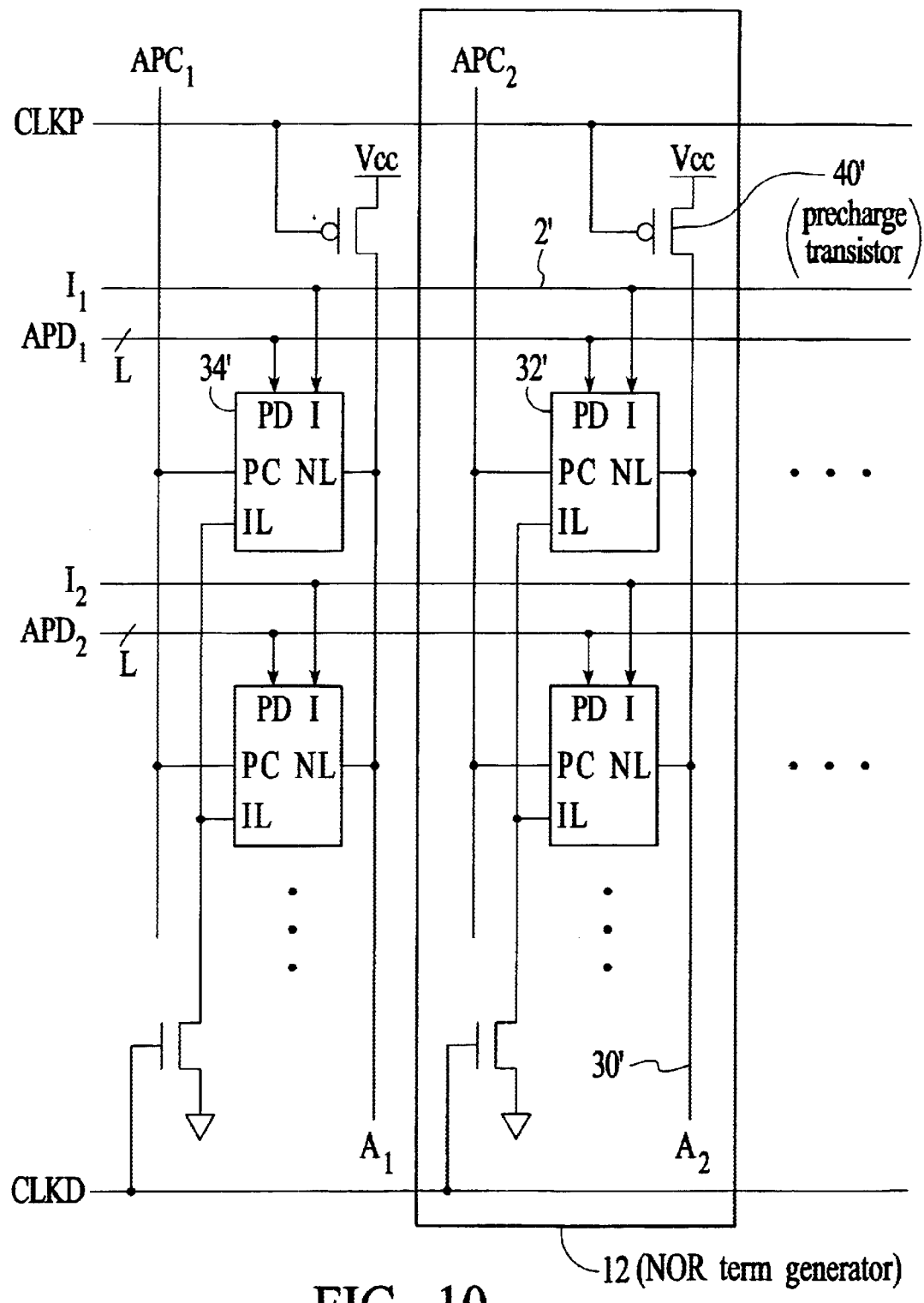
Figure 13:
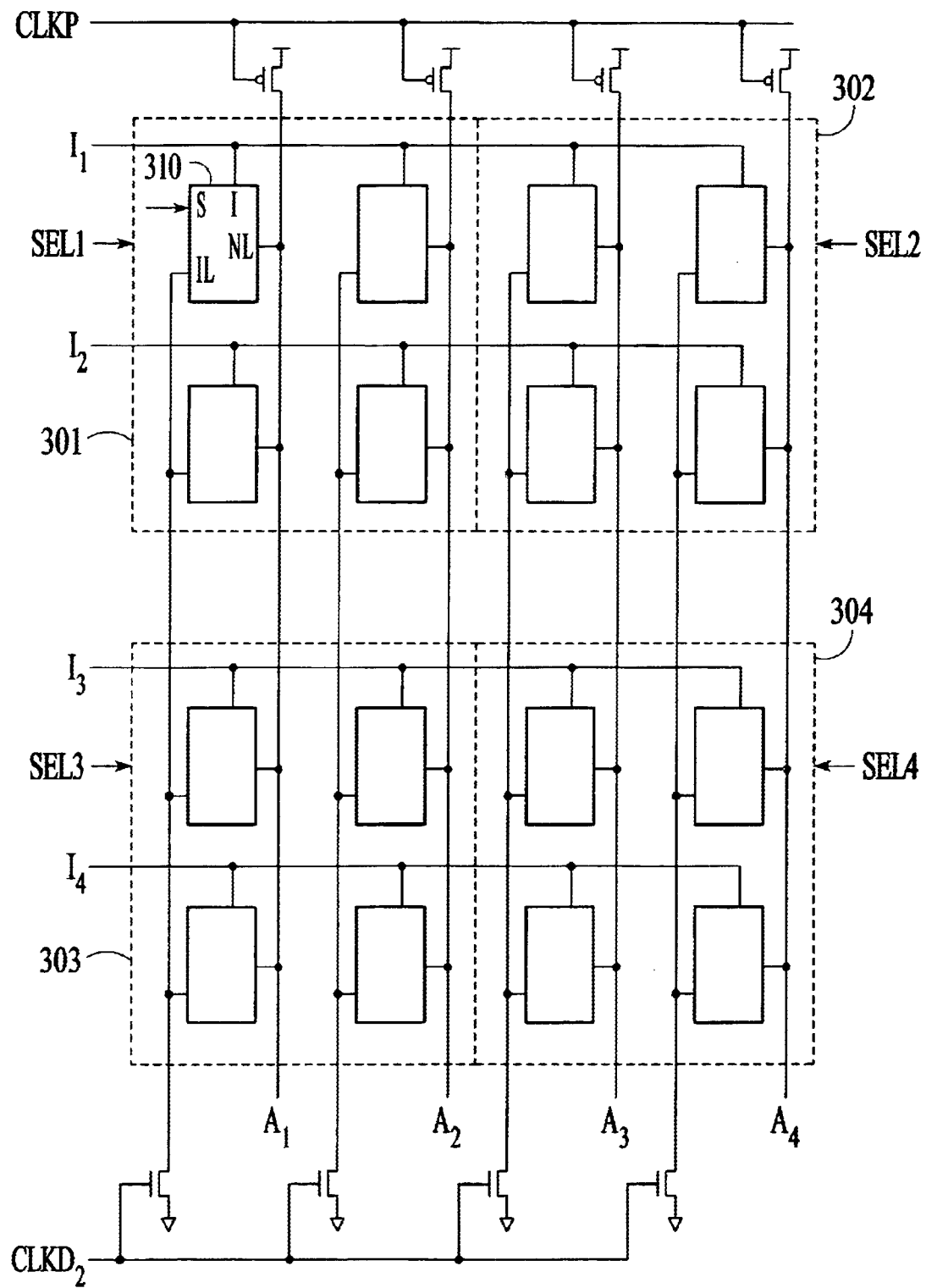
FIG. 13 shows the AND plane can be divided into four sub-arrays, each sub-array having a separate configuration select signal SEL1, SEL2, SEL3 and SEL4, respectively.
Figure 14:
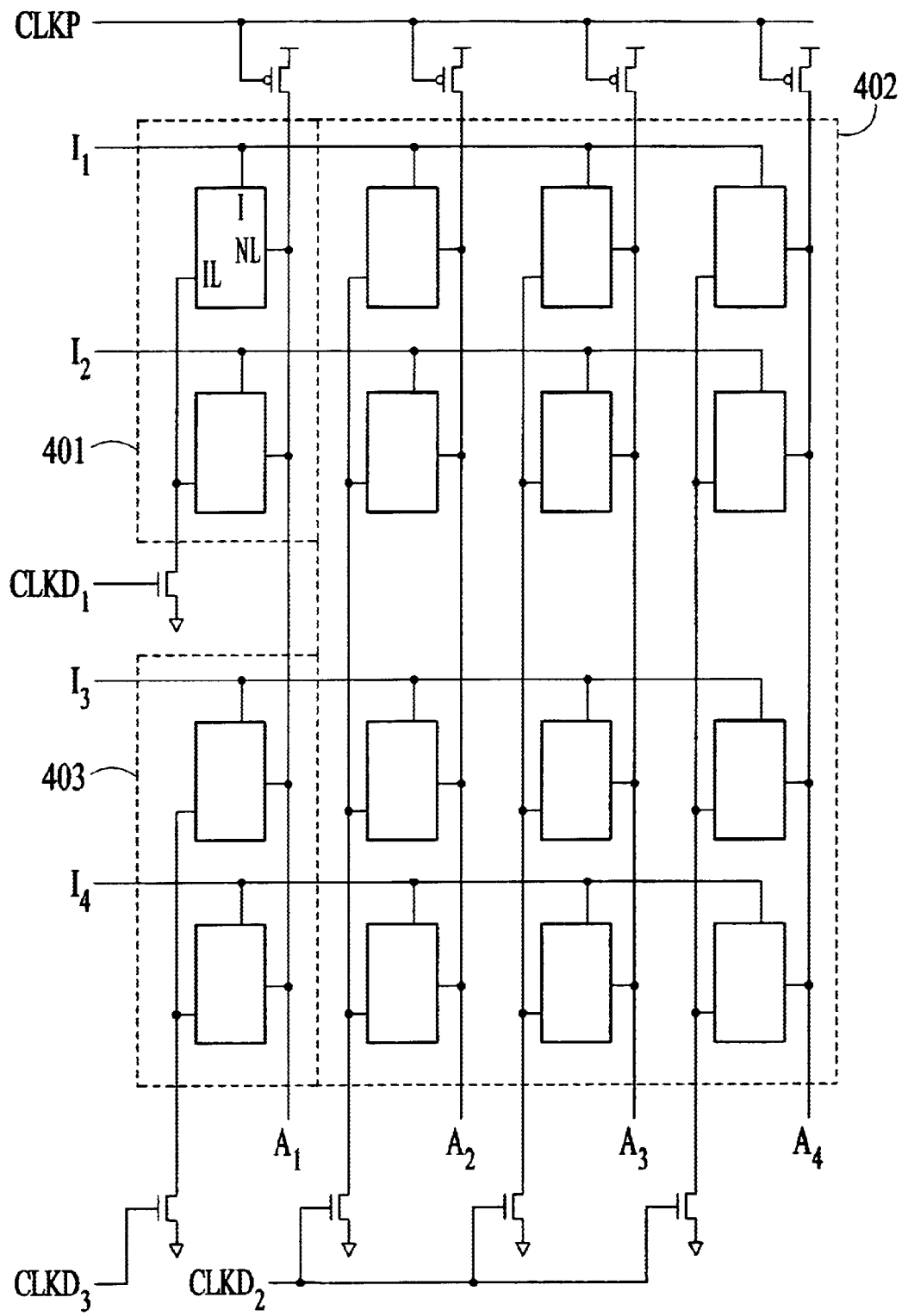
FIG. 14 shows an array partitioned into three sub-arrays, each sub-array having a separate evaluate control clock CLKD1, CLKD2 and CLKD3, respectively.
Figure 15:
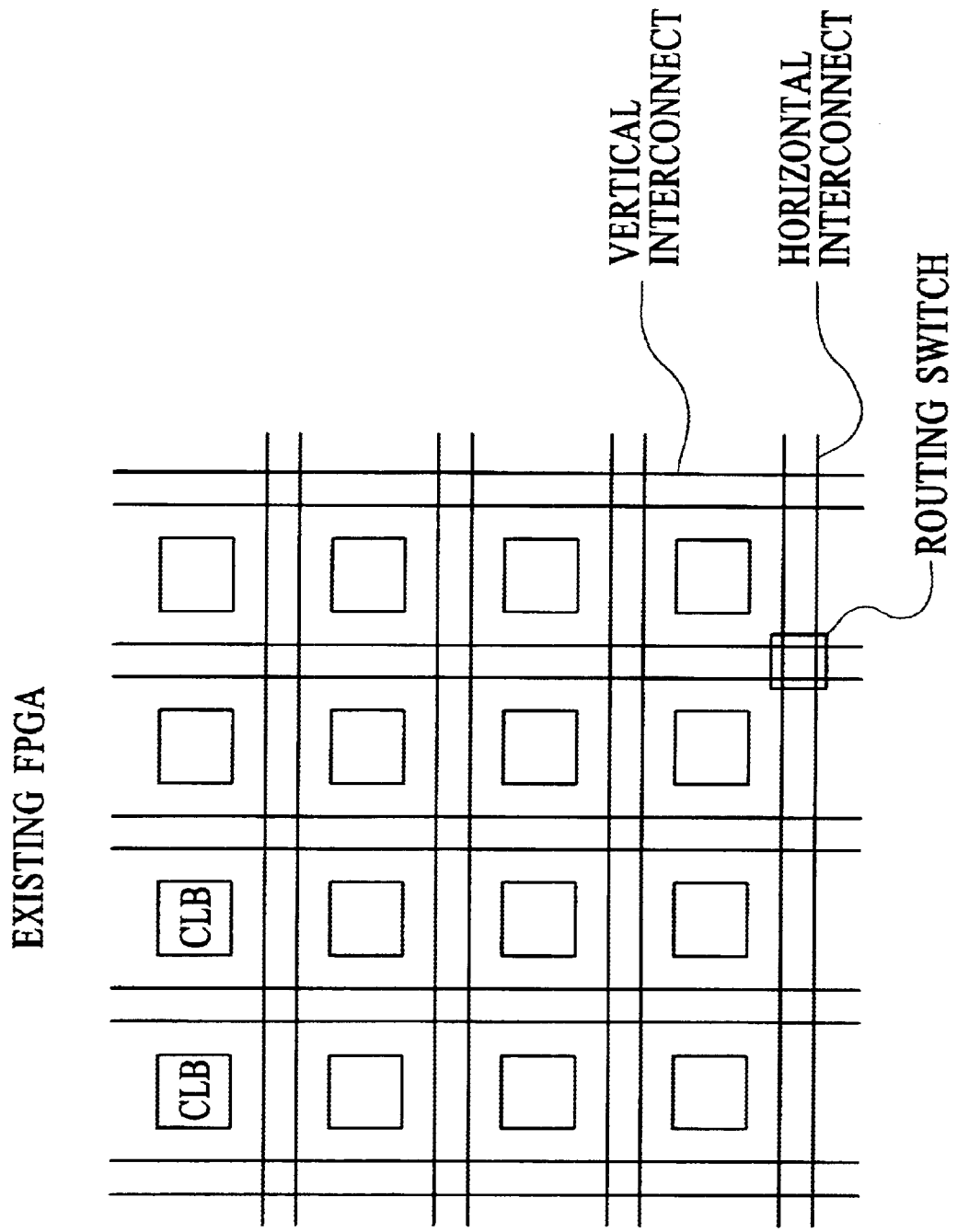
FIG. 15 shows a conceptual diagram of an existing FPGA.
Figure 16:
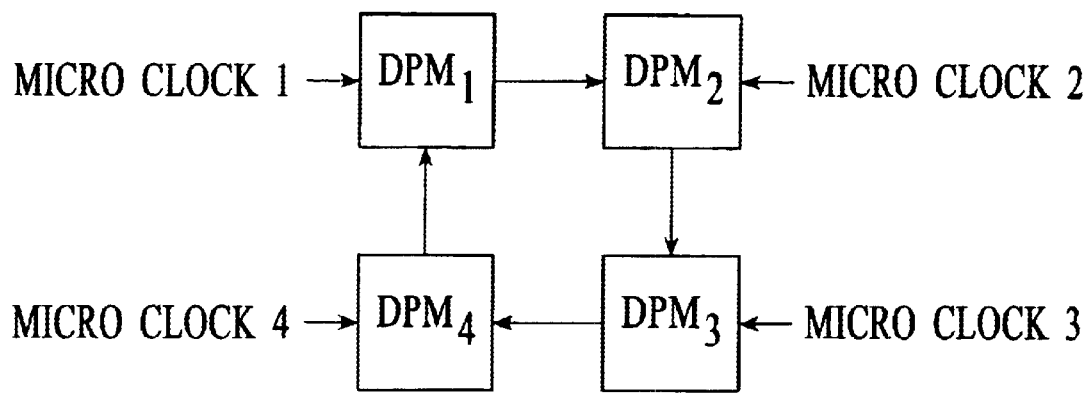
FIG. 16 shows a conceptual arrangement of four dynamic programmable modules (DPMs), each controlled by a separate micro clock.
Figure 17A:
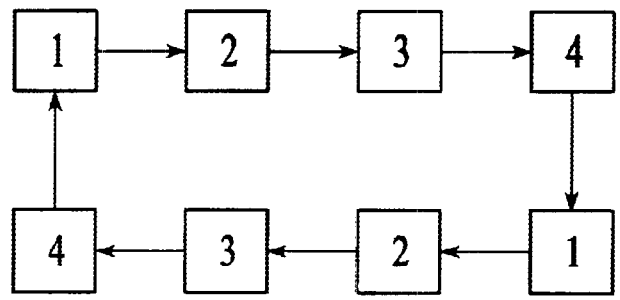
FIGS. 17a-b shows a preferred physical arrangement of DPMs to minimize connection distance between $DPM_4$ and $DPM_1$.
Figure 17B:
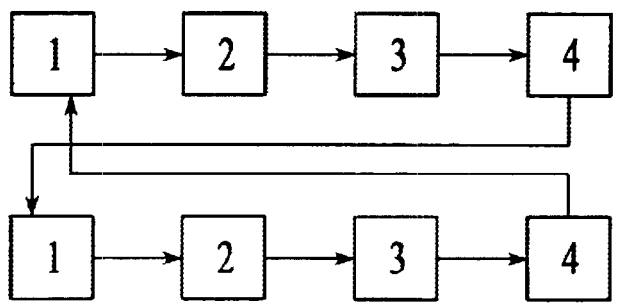

Field-programmable dynamic logic arrays (FPDLAs) consist of an array of dynamic programmable modules (DPMs), each controlled by a micro clock. Each DPM consist of one or a cascaded combination of reprogrammable, reconfigurable and fixed-function dynamic PLAs. A fixed-function dynamic PLA is one that is not reprogrammable or configurable. FIG. 16 shows an arrangement of four DPMs, each DPM controlled by a micro clock that starts its evaluate phase. A DPM controlled by micro clock j is denoted as $DPM_j$. In this system of four micro clocks 1, 2, 3, and 4 asserting repeatedly, $DPM_1$ outputs are connected to $DPM_2$ inputs, $DPM_2$ outputs are connected to $DPM_3$ inputs, $DPM_3$ outputs are connected to $DPM_4$ inputs, and $DPM_4$ outputs are connected to $DPM_1$ inputs. A DPM whose inputs come from another DPM's outputs is said to be chronologically next to that DPM. For instance, $DPM_2$ is chronologically next to $DPM_1$. Each micro clock is asserted after a sufficient time for all outputs of a DPM to become valid at the inputs of the chronologically next DPM. For instance, micro clock 2 would be asserted to start the evaluate phase of $DPM_2$ after there has been sufficient time for $DPM_1$ outputs to become valid at the inputs of $DPM_2$. Providing sufficient delay between each micro clock assertion is required for correct operation of the DPMs. For this reason, it is desirable to shape and arrange the DPMs to avoid one signal path requiring much longer time delay than the rest. For instance, the arrangement shown in FIG. 17A would be preferable to the arrangement shown in FIG. 17B, since the connection between $DPM_1$ and $DPM_4$ would be physically shorter and therefore incur a shorter time delay.

Figure 18:
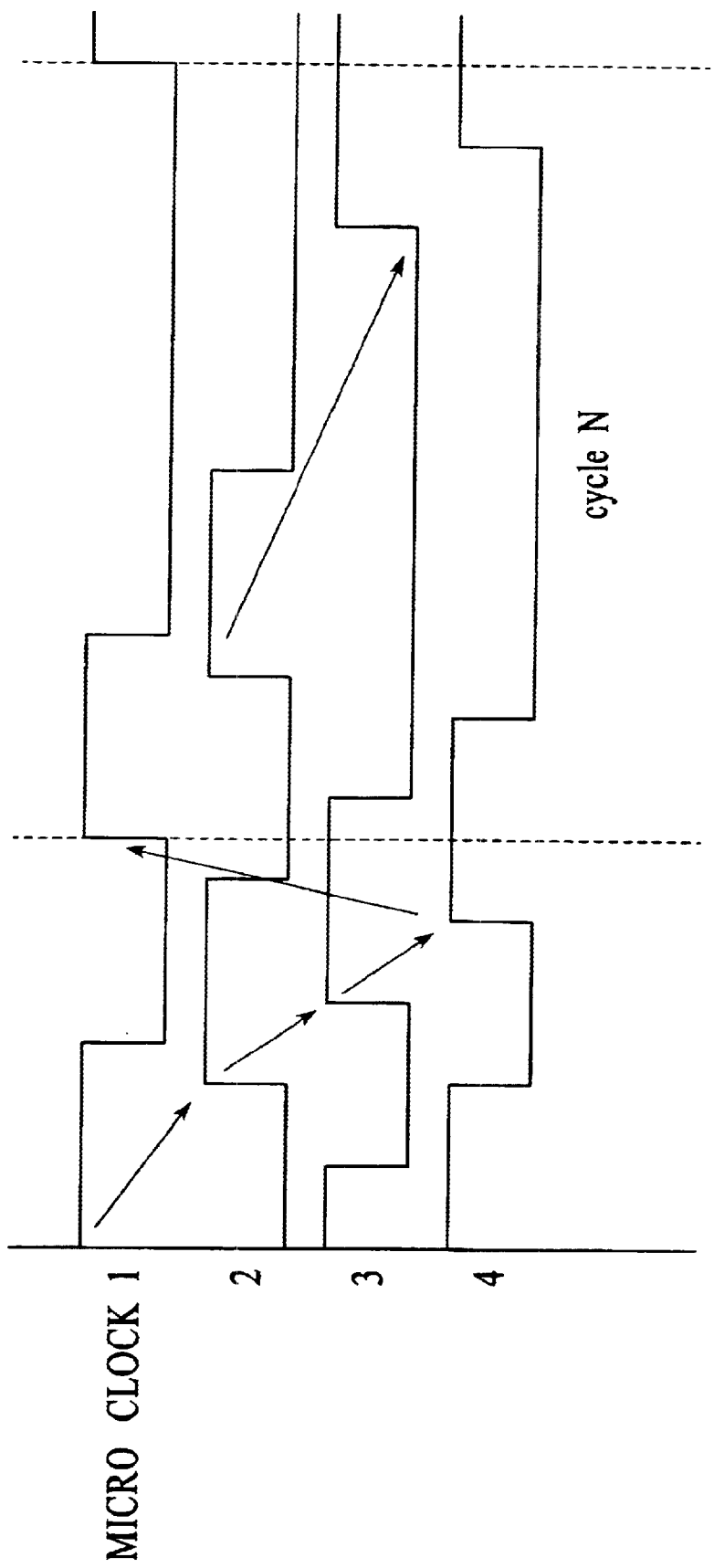
FIG. 18 shows the time delay between micro clock 1 and 2 assertions is longer than that of the others and the time delay between micro clock 2 and 3 assertions can be lengthened only during cycle N.

The time delay between each micro clock assertion does not have to be of the same duration. It may be desirable, or even necessary, to have different amount of time delays between different micro clock assertions in some designs. For example, it may be desirable to have a longer time delay between assertions of micro clocks 1 and 2, as shown in FIG. 18, to make $DPM_1$ larger and have its outputs travel farther than the other DPMs. It is also possible to lengthen the time delay between any two micro clock assertions, much the same way that a clock period can be stretched in systems designed using static logic. For example, the time delay between the micro clock 2 and 3 assertions can be lengthened during cycle N if necessary, as shown in FIG. 18. In such a case, the precharge must also be delayed appropriately to accommodate the delayed start of the evaluate phase, i.e., as shown in cycle N of FIG. 18, the precharge of $DPM_2$ must also be delayed until after $DPM_2$ outputs are no longer needed by $DPM_3$.

Figure 19:
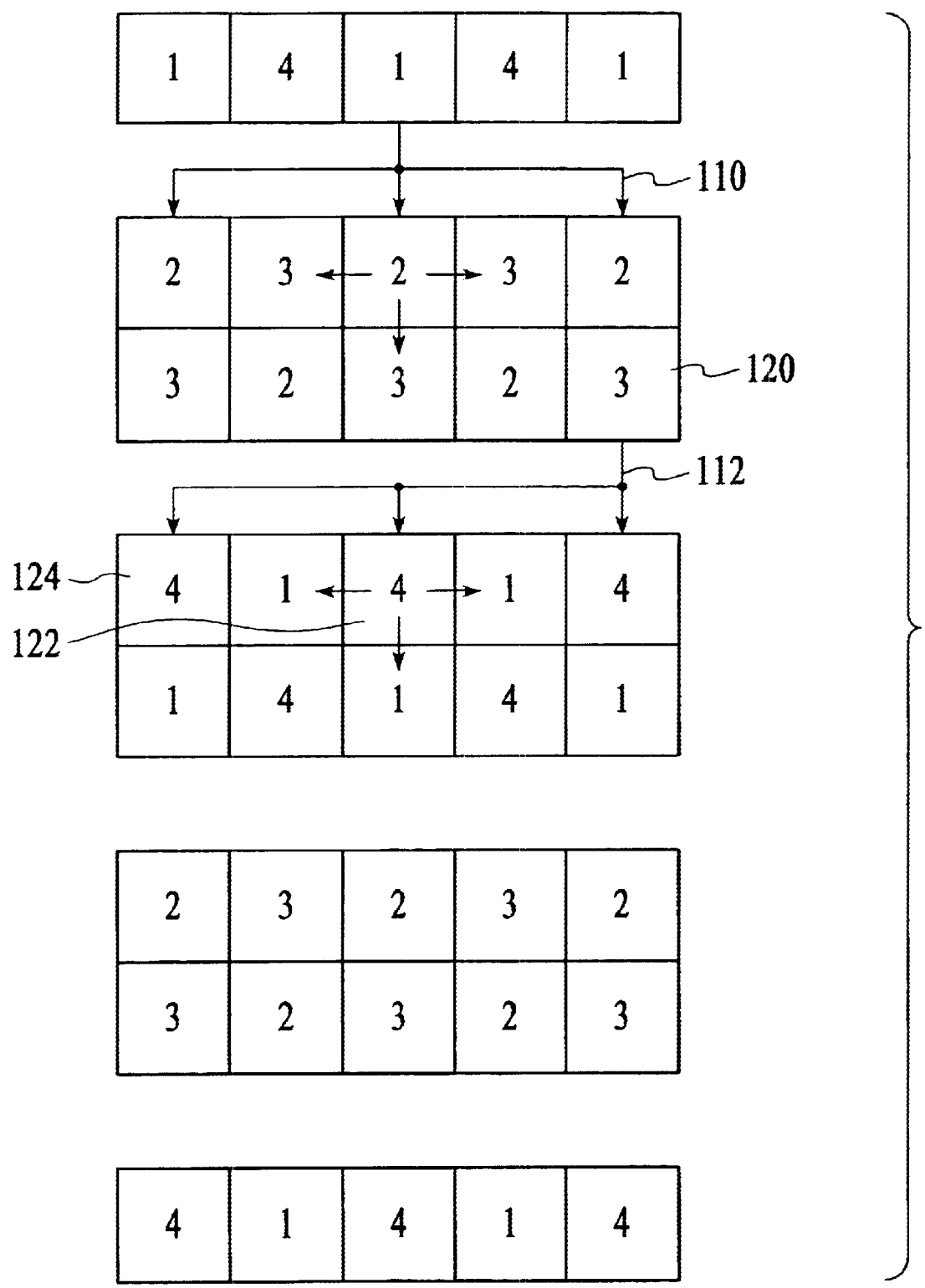
FIG. 19 shows that routing channels can be used to provide additional connections between distant DPMs.

FPDLAs should be designed to connect each DPM's outputs to as many of its chronologically next DPMs as possible while minimizing the required time delay between each micro clock assertion. These are conflicting requirements, since connecting one DPM's outputs to many demands more wires covering greater distances whereas minimizing time delays between micro clock assertions demands fewer and shorter wires. FIG. 19 shows an example FPDLA design using four micro clocks. It shows four types of DPMs, one for each micro clock, arranged to keep the distances between the DPMs and their chronologically next DPMs short. In this arrangement, each $DPM_2$ is physically adjacent to three $DPM_3$, and each $DPM_4$ is also physically adjacent to three $DPM_1$, whereas each $DPM_1$ and $DPM_3$ is physically adjacent to only one $DPM_2$ and $DPM_4$, respectively. To remedy this imbalance, routing channels can be used to connect the outputs of each $DPM_1$, to two additional $DPM_2$ and the outputs of each $DPM_3$ to two additional $DPM_4$, as shown in routing channels 110 and 112, respectively.

Unlike existing FPGAs that use separate circuit structures for programmable logic and programmable interconnects, FPDLAs can use the programmable function built into the DPMs to provide both. This is possible because each NOR term generator has a programmable switch for each input that determines whether or not the associated input is to affect the NOR term output. Each NOR term generator can be programmed to provide a one-to-one or many-to-one connection between its inputs and output. A one-to-many connection is made by connecting one output to inputs of many NOR term generators. Establishing a one-to-many connection does not require a separate programmable switch since that switch is already built into the NOR term generator receiving the input. Therefore, routing channels in FPDLAs can be built using nothing but wires. Today's multiple metal-layer semiconductor processes allow these routing channels to be built over the active areas of DPMs, unlike illustrated in FIG. 19. FPDLAs can also use separate programmable interconnect switches consisting of multiplexors whose select control signals are kept in programmable storage elements.

Although routing channels may be provided to connect distant DPMs, the time delay between micro clock assertions may not need to be lengthened if the connections are not used. For example, if $DPM_1$ outputs are used by a distant $DPM_2$ but $DPM_3$ outputs are not used by any distant $DPM_4$, the time delay between micro clock 1 and 2 assertions should be lengthened but that between 3 and 4 assertions need not be lengthened beyond what is needed for $DPM_3$ outputs to reach their physically adjacent $DPM_4$. Furthermore, micro clock assertions need to be delayed only long enough for the signals to reach the chronologically next DPMs that actually use them. For example, as shown in routing channel 112 that connects $DPM_3$ 120 to $DPM_4$ 122 and 124 in FIG. 19, if $DPM_4$ 124 does not use the outputs of $DPM_3$ 120, the time delay between micro clock 3 and 4 assertions need to be lengthened only enough for the outputs of $DPM_3$ 120 to reach $DPM_4$ 122 but not 124.

The FPDLAs can be built with any number of micro clocks. Obviously, the FPDLAs built using more micro clocks can accommodate more logic, since each additional micro clock allows one more set of DPMs to be used. However, if the entire set of micro clocks is to be mapped to a clock cycle in pipelined designs, it is desirable to use fewer micro clocks since a clock period would be equivalent to the sum of the micro clock assertions in this case. That is, if four micro clock assertions in FPDLAs built using four micro clocks are mapped to one clock cycle, the resulting clock period would be equivalent to the sum of the time delay between the four micro clock assertions. In such a case, it would be desirable to use three micro clocks than four, all other things being equal, since the sum of the time delay between three micro clocks would be shorter than that of four micro clocks.

Inputs and outputs to FPDLAs are also controlled with the micro clocks, and can be built in separate modules or within some of the DPMs. In FPDLAs that use four micro clocks, for example, there can be four sets of inputs and outputs, one for each micro clock. The inputs and outputs controlled by micro clock j are denoted as $I_j$ and $O_j$, respectively. The inputs $I_j$ must be valid before micro clock j asserts and held stable throughout the evaluate phase, much the same manner that the inputs to $DPM_j$ must be valid before micro clock j asserts and be held stable throughout the evaluate phase of $DPM_j$. The outputs $O_j$ will become valid shortly after micro clock j asserts and will be held stable until $DPM_j$ enters the precharge phase. The timing characteristics of the inputs and outputs, such as the setup and hold time for inputs and the data valid time of the outputs, can be adjusted in enumerable ways using buffers and latches, which are well known in the industry.

FPDLAs can be built as stand alone semiconductor chips, similar to existing FPGAs. FPDLAs can also be built as modules within larger semiconductor chips that may incorporate static logic and different clocking schemes. Because FPDLAs use dynamic logic, which offers superior speed and density in implementing complex and regular circuit structures than static logic, FPDLA are particularly well suited in implementing programmable decoders and data paths. Decoders are used in practically all systems whose inputs are represented in an encoded form to reduce the amount of bits needed to convey information. The most commonly known example of decoders is found in all processors that execute programs composed of an instruction set. Some examples of data paths are various types of arithmetic-and-logic units, floating-point units, multimedia execution units, and digital-signal processing units commonly found in various types of microprocessors, including CISC, RISC, DSP, VLIW, and SIMD. Graphics processors also use integer, floating-point and SIMD type of data paths in the many stages of geometry and rendering phases. Some example stages are projection, culling, clipping, lighting, shading, texturing, blending, and depth sorting. Network processors also use data paths for pattern matching of various types and lengths, required by different network protocols and algorithms. FPDLAs can be used to implement these and many other types of decoders and data paths that can be reprogrammed or reconfigured to provide different functions.

Although the present invention has been described in accordance with the embodiments shown, one of ordinary skill in the art will readily recognize that there could be variations to the embodiments and those variations would be within the spirit and scope of the present invention. Accordingly, many modifications may be made by one or ordinary skill in the art without departing from the spirit and scope of the appended claims.

What is claimed is:

1. A field-programmable dynamic logic array (FPDLA) comprising:
   an array of at least one dynamic programmable module (DPM), the at least one DPM comprises a cascaded combination of at least one dynamic PLA (DPLA), the at least one DPLA having an output and an input; and
   at least one micro clock, wherein each of the at least one DPM is controlled by the at least one micro clock, wherein at least one output of the at least one DPM is coupled to at least one input of at least one chronologically next DPM, and wherein the at least one DPM is controlled by its micro clock and the at least one chronologically next DPM is controlled by a second micro clock, the second micro clock is asserted after a sufficient time for the at least one output of the at least one DPM to become valid at the at least one input of the at least one chronologically next DPM.

2. The FDPLA of claim 1 wherein the at least one DPLA is reprogrammable.

3. The FDPLA of claim 1 wherein the at least one DPLA is reconfigurable.

4. The FDPLA of claim 1 wherein the at least one DPLA implements a fixed function.

5. The FPDLA of claim 1 wherein the DPMs are arranged to minimize the connection distance between each DPM and its chronologically next DPMs.

6. The FPDLA of claim 1 wherein the time delay between micro clock assertions are of the same duration.

7. The FPDLA of claim 1 wherein the time delay between micro clock assertions are of different duration.

8. The FPDLA of claim 1 wherein the time delay between any two micro clock assertions can be arbitrarily lengthened.

9. The FPDLA of claim 1 wherein routing channels are added for connections between DPMs.

10. The FPDLA of claim 1 wherein the entire set of micro clocks are mapped to a clock cycle.

11. The FPDLA of claim 1 wherein a subset of the entire set of micro clocks are mapped to a clock cycle.

12. The FPDLA of claim 1 wherein programmable interconnects built using static circuit structure connect the DPMs.

13. The FPDLA of claim 1 is used in a programmable decoder.

14. The FPDLA of claim 1 is used in a programmable data path such as in arithmetic-and-logic units, floating-point units, multimedia execution units and digital-signal processing units.

15. The FPDLA of claim 1 is used in a stand-alone programmable semiconductor device.

16. The FPDLA of claim 1 is used within a larger semiconductor device.

17. A field-programmable dynamic logic array (FPDLA) comprising:
   an array of at least one dynamic programmable module (DPM) and at least one chronologically next DPM, wherein each DPM comprises a micro clock and at least one dynamic PLA (DPLA) having at least one input and at least one output;
   the at least one output of the at least one DPM is coupled to at least one input of the at least one chronologically next DPM; and
   the micro clock controlling the chronologically next DPM is asserted after a sufficient time for the at least one output of the at least one DPM to become valid at the at least one input of the at least one chronologically next DPM.

18. A field-programmable dynamic logic array (FPDLA) comprising:
   an array of at least one dynamic programmable module (DPM) and at least one chronologically next DPM, wherein each DPM consists of a micro clock and at least one reprogrammable dynamic PLA (DPLA) having at least one input and at least one output;
   the at least one output of the at least one DPM is coupled to at least one output of the at least one chronologically next DPM; and
   the micro clock controlling the chronologically next DPM is asserted after a sufficient time for the at least one output of the at least one DPM to become valid at the at least one input of the at least one chronologically next DPM.

19. A field-programmable dynamic logic array (FPDLA) comprising:
   an array of at least one dynamic programmable module (DPM) and at least one chronologically next DPM, wherein each DPM consists of a micro clock and at least one reconfigurable dynamic PLA (DPLA) having at least one input and at least one output;
   the at least one output of the at least one DPM is coupled to at least one input of the at least one chronologically next DPM; and
   the micro clock controlling the chronologically next DPM is asserted after a sufficient time for the at least one output of the at least one DPM to become valid at the at least one input of the at least one chronologically next DPM.

* * * * *